United States Patent
Karasawa et al.

(10) Patent No.: US 6,468,850 B2
(45) Date of Patent: Oct. 22, 2002

(54) METHOD OF MANUFACTURING A SEMICONDUCTOR MEMORY DEVICE

(75) Inventors: Junichi Karasawa, Tatsuno-machi (JP); Kunio Watanabe, Sakata (JP); Takashi Kumagai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/907,097

(22) Filed: Jul. 16, 2001

(65) Prior Publication Data

US 2002/0008288 A1 Jan. 24, 2002

Related U.S. Application Data

(62) Division of application No. 09/450,102, filed on Nov. 29, 1999, now Pat. No. 6,320,234.

(30) Foreign Application Priority Data

Nov. 30, 1998 (JP) .......................................... 10-355346

(51) Int. Cl.$^7$ ........................................ H01L 21/8238
(52) U.S. Cl. ...................... 438/200; 438/241; 438/228; 438/130
(58) Field of Search ................ 438/200, 199, 438/201, 228, 241, 258, 130

(56) References Cited

U.S. PATENT DOCUMENTS

| | | | | |
|---|---|---|---|---|
| 4,855,956 A | * | 8/1989 | Urai ............................. | 365/210 |
| 5,017,507 A | * | 5/1991 | Miyazawa ................... | 438/227 |
| 5,641,699 A | * | 6/1997 | Hirase et al. ................ | 438/241 |
| 5,924,991 A | | 7/1999 | Lee .............................. | 438/228 |
| 5,945,715 A | | 8/1999 | Kuriyama .................... | 257/369 |
| 6,028,341 A | * | 2/2000 | Tai et al. ...................... | 257/372 |
| 6,180,448 B1 | * | 1/2001 | Lee .............................. | 438/253 |
| 6,326,254 B1 | * | 12/2001 | Ema et al. ................... | 438/228 |

FOREIGN PATENT DOCUMENTS

| | | |
|---|---|---|
| JP | 08-330528 | 12/1996 |
| JP | 09-199612 | 7/1997 |

* cited by examiner

*Primary Examiner*—Michael Trinh
(74) *Attorney, Agent, or Firm*—Hogan & Hartson, LLP

(57) ABSTRACT

A semiconductor device has a semiconductor substrate having a peripheral circuit area and a memory cell area. A border region having a well of a first conductivity is formed between the peripheral circuit area and the memory cell area. A well of a second conductivity is formed in the peripheral circuit area. The well in the peripheral circuit area is in contact with the border region but not in contact with the memory cell area. Dummy transistors are formed in the border region. The dummy transistors are arranged with substantially the same transistor forming density as that of the memory cell area.

2 Claims, 18 Drawing Sheets

METHOD OF MANUFACTURING A SEMICONDUCTOR MEMORY DEVICE

This is a divisional of application Ser. No. 09/450,102 filed Nov. 29, 1999, U.S. Pat. No. 6,320,234, which application is hereby incorporated by reference in its entirety.

BACKGROUND OF THE INVENTION

1. Field of the Invention

The present invention relates to a semiconductor memory device and a manufacturing method for manufacturing the semiconductor memory device.

2. Description of Related Art

Semiconductor memory devices have memory cell areas and peripheral circuit areas. A large number of device elements are formed in the memory cell area, and the device elements formed therein are miniaturized, compared to device elements formed in the peripheral circuit area. When a semiconductor memory device is manufactured, memory cells adjacent to the border of the peripheral circuit area are subject to the proximity effect of light and the loading effect, because of the difference in density between the peripheral circuit area and the memory cell area. This may cause defective memory cells.

SUMMARY OF THE INVENTION

The present invention has been developed to solve the above-described problem. It is an object of the present invention to provide a semiconductor memory device and a method for manufacturing the semiconductor memory device, which are less susceptible to the proximity effect and the loading effect.

In accordance with one embodiment of the present invention, a semiconductor memory device has a semiconductor substrate that defines a main surface, a peripheral circuit area and a memory cell area on the main surface of the semiconductor substrate. Peripheral circuits are formed in the peripheral circuit area, and memory cells are formed in the memory cell area. The semiconductor memory device includes a first well formed in the peripheral circuit area, and a second well of a first conductivity type formed in the memory cell area and having a depth shallower than a depth of the first well. A third well of a second conductivity type is formed in the memory cell area. The third well is in contact with the second well and equal in depth to the second well. A device isolation structure is formed in the memory cell area. The second well and the third well are formed down to a level lower than the device isolation structure. The semiconductor memory device of the present invention has a border region between the peripheral circuit area and the memory cell area. Dummy elements that do not function as active device elements are formed in the border region in substantially the same forming density as that of the memory cells. The dummy elements are located on the same layer on which field effect transistors of the memory cells are formed. The first well is in contact with the border region, but not in contact with the memory cell area.

The cell arrangement described above prevents the memory cell from becoming defective under the proximity effect and the loading effect, attributable to a difference between the device element forming density in the peripheral circuit area and the device element forming density in the memory cell area. In one feature of the present embodiment, the dummy elements, which do not function as active device elements, are subjected to misalignment or deformation of resist patterns, which are attributable to the proximity effect and the loading effect, and which occur during the formation of the first well. As a result, other device elements, such as transistors, in the memory cell area are prevented from being affected by the proximity effect and the loading effect.

The device element forming density of the dummy elements may not be exactly the same as that of the memory cells to substantially prevent the memory cells from becoming defective under the proximity effect and the loading effect. In other words, the device element forming density for the dummy elements may or may not be exactly the same as that for the memory cells within a certain range to substantially prevent the memory cells from becoming defective under the proximity effect and the loading effect. In accordance with one embodiment, substantially the same device element forming density for the dummy elements and the memory cells may be attained when the dummy elements and the memory cells are arranged in an identical pattern (for example, in terms of the width of wells, well spacing, gate length, gate width, active area, inter-gate distance, and so forth).

The second well has the same depth as the depth of the third well in accordance with one embodiment of the present invention. Therefore, substantially no imbalance occurs in performance between transistors, attributable to the difference between the well depths. It is noted that, in this specification, the term "the same depth" is not strictly limited to the same depth but also covers a well depth difference that causes substantially no imbalance in performance among transistors.

Also, in this specification, the device isolation structure refers to a LOCOS oxidation layer, a semi-recessed LOCOS oxidation layer or a shallow trench (as deep as about 0.4 to about 0.8 $\mu$m).

In a semiconductor memory device in accordance with one embodiment of the present invention, the length of the border region may preferably be equivalent to the length that covers 1.5 to 3 memory cells that are arranged at a predetermined pitch in the memory cell area. If the length of the border region is shorter than 1.5 memory cells, the dimension of a well pattern for the border region becomes smaller than a well pattern for the memory cell area (in terms of the line width and spacing), when the second and third wells are formed in the border region. With this arrangement, a difference occurs between the pitch of the wells in the memory cell area and the pitch of the wells in the border region. As a result, accuracy in processing well patterns for the memory cell area is substantially reduced.

When the border region is disposed in a direction parallel to a direction in which wells alternate at a fine pitch in the memory cell area, for example, in an SRAM, the length of the border region needs not be longer than 1.5 cells. Any length of the border region is acceptable if it can absorb the proximity effect created during the formation of the first well.

Preferably, the length of the border region is set to cover 3 memory cells or shorter that are arranged at a predetermined pitch, because a border region longer than 3 cells causes the area of the semiconductor memory device to increase.

In a semiconductor memory device in accordance with one embodiment of the present invention, the border region may preferably have a well contact region. A potential is supplied to the well of the memory cell through the well contact region. Because the border region is designed to serve as the well contact region, the semiconductor memory device is miniaturized.

In a semiconductor memory device in accordance with one embodiment of the present invention, the first well may preferably be composed of a twin-well having an n-type well and a p-type well. The second well and the third well may also be formed in the border region. In a preferred embodiment, at least a part of the second well and at least a part of the third well may be formed in the border region. The n-type well of the first well may preferably be disposed between the second well or the third well, whichever is of a p-type, and the p-type well of the first well.

A substrate current may result in a latchup. The substrate current flowing through a p-type well (n-channel transistor formation area) is greater than a substrate current flowing through an n-type well (p-channel transistor formation area). The latchup margin is small in the memory cell area and the border region where wells are provided in a fine pitch. If the n-type well of the first well is arranged between the p-type well of the border region and the p-type well of the first well, the p-type well of the border region is isolated from the p-type well of the first well. This arrangement prevents the substrate current from flowing from the p-type well of the first well into the p-type well of the border region, thereby improving latchup withstandability.

In the above structure, the semiconductor substrate may preferably be of a p-type. As a result, the p-type wells are interconnected to each other in the memory cell area via the semiconductor substrate, and the well resistance is reduced. The reduced well resistance suppresses substrate potential from rising in the n-channel transistors that have a relatively large substrate current among the n-channel transistors and p-channel transistors in the memory cell area.

In the semiconductor memory device in accordance with one embodiment of the present invention, the first well, the second well and the third well may preferably be retrograded wells. The retrograded well refers to a well that is produced using a high-energy ion implantation, rather than thermal diffusion.

In the semiconductor memory device in accordance with one embodiment of the present invention, a CMOS cell type SRAM is formed in the memory cell area. The CMOS cell type SRAM refers to an SRAM in which each cell is formed from CMOS.

In accordance with one embodiment of the present invention, the depths of the second well and the third well are preferably within a range from about 0.5 $\mu$m to about 1.2 $\mu$m. If the depths of the second well and the third well are shallower than about 0.5 $\mu$m, the depth of the device isolation structure becomes deeper than the depths of the wells. This creates the problem in forming the well contact region for fixing the well potential. The second well and the third well deeper than about 1.2 $\mu$m creates another problem in that the overlapped area between the second and third wells expands beneath the device isolation structure.

In accordance with one embodiment of the present invention, a semiconductor memory device having a peripheral circuit area, a memory cell area, and a border region positioned in a border between the peripheral circuit area and the memory cell area, on a main surface of a semiconductor substrate may be manufactured by a method including at least the following steps: (a) the step of forming a device isolation structure on the main surface of the semiconductor substrate; (b) the step of forming a first well in contact with the border region but not in contact with the memory cell area, by ion-implanting an impurity in the peripheral circuit area only; (c) the step of forming a second well of a first conductivity type by ion-implanting an impurity in the memory cell area, wherein the second well is shallower in depth than the first well and is formed down to a level lower than the device isolation structure; (d) the step of forming a third well of a second conductivity type by ion-implanting an impurity in the memory cell area, wherein the third well is equal in depth to the second well and is adjacent to the second well beneath the device isolation structure; and (e) the step of forming a field effect transistor in the memory cell area. In accordance with one embodiment of the present invention, step (e) includes the step of forming dummy elements, that do not function as active device elements, in the border region at the same device element forming density as that of the memory cells.

In accordance with the embodiment of the present invention, a method for manufacturing a semiconductor memory device having a dummy element is provided.

In accordance with one embodiment of the present invention, step (b) includes forming a twin-well composed of an n-type well and a p-type well, with the n-type well positioned adjacent to the border region, step (c) includes forming the second well in the border region, and step (d) includes forming the third well in the border region. In one embodiment, the second well or the third well, whichever is of the p-type, is positioned adjacent to the peripheral circuit area.

The above embodiment provides a manufacturing method for manufacturing the structure in which the n-type well of the first well is located between the p-type well of the first well and the p-type well of the border region.

Either a positive resist or a negative resist will work as the resist pattern in step (b). Either a positive resist or a negative resist will work as the resist pattern in steps (c) and (d) as well. However, in a more preferred embodiment, a positive resist is used in steps (c) and (d). This is because the positive resist outperforms the negative resist in the control of the vertical configuration of the end portion of the resist pattern and the dimensional control of the resist pattern.

Other features and advantages of the invention will be apparent from the following detailed description, taken in conjunction with the accompanying drawings which illustrate, by way of example, various features of embodiments of the invention.

DESCRIPTION OF EMBODIMENTS

Figure 1:
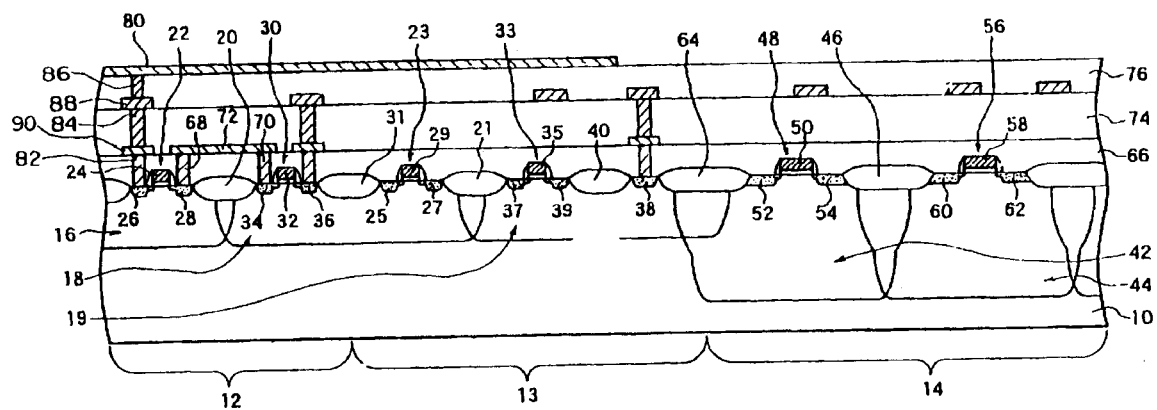
FIG. 1 is a cross-sectional view of a semiconductor memory device in accordance with one embodiment of the present invention.

FIG. 1 is a cross-sectional view of a semiconductor memory device in accordance with one embodiment of the present invention. The semiconductor memory device is an SRAM. Referring to FIG. 1, the semiconductor memory device has a p-type silicon substrate 10, for example. The p-type silicon substrate 10 defines a main surface that is divided into a memory cell area 12, a border region 13, and a peripheral circuit area 14.

A p-well 16 and an n-well 18 are formed in the memory cell area 12. The p-well 16 is equal in depth to the n-well 18. The p-well 16 and the n-well 18 are retrograded wells. The p-well 16 and the n-well 18 overlap each other in a border area between the p-well 16 and the n-well 18. A semi-recessed LOCOS oxidation layer 20 is formed on the border area.

An n-channel transistor 22 is formed in the p-well 16. The n-channel transistor 22 includes a gate electrode 24, a source 26, and a drain 28. A p-channel transistor 30 is formed in the n-well 18. The p-channel transistor 30 includes a gate electrode 32, a drain 34 and a source 36.

A border region 13 is positioned next to the memory cell area 12. The n-well 18 in the memory cell area 12 extends into the border region 13. A p-well 19 is formed adjacent to the n-well 18. The p-well 19 is produced at the same depth as the depth of the p-well 16 and at the same manufacturing step as that for the p-well 16. The p-well 19 is a retrograded well. The n-well 18 and the p-well 19 overlap each other at their border. A semi-recessed LOCOS oxidation layer 21 is formed over the border between the n-well 18 and the p-well 19.

A dummy transistor 23 is formed in the n-well 18 in the border region 13. The dummy transistor 23 is formed at the same time when transistors 30 and 48 are formed. The dummy transistor 23 includes impurity regions 25 and 27 which are formed at the formation of a source and drain, and a polysilicon layer 29 which is formed at the formation of a gate electrode. Although the dummy transistor 23 has the structure of a MOS transistor, it does not function as a MOS transistor. The dummy transistor 23 is isolated by a semi-recessed LOCOS oxidation layer 31 from the p-channel transistor 30 that functions as a memory cell.

A dummy transistor 33 is formed in the p-well 19. The dummy transistor 33 is formed at the same time when transistors 22 and 56 are formed. The dummy transistor 33 includes impurity regions 37 and 39 which are produced at the formation of a source and drain, and a polysilicon layer 35 which is produced at the formation of a gate electrode. Although the dummy transistor 33 has the structure of a MOS transistor, it does not function as a MOS transistor.

A well contact region 38 is formed in the p-well 19. The p-well 19 is supplied with a potential through the well contact region 38 to fix transistor bulk potential. A well contact region is also formed in each of the p-wells 16 and 44 and the n-wells 18 and 42, although they are not shown.

The well contact region 38 is isolated from the dummy transistor 33 by a semi-recessed LOCOS oxidation layer 40. The potentials of the impurity regions 25, 27, 37, and 39 in the dummy transistors 23 and 33 in the border region 13 are placed in a floating state. The reason for this is as follows. In the border region, for example, the gate is formed to be finer in dimension than its designed dimensions, to thereby provide a transistor having a low punchthrough margin. By setting the impurity regions 25, 27, 37 and 39 in a floating state, a current path is disconnected.

In the peripheral circuit area 14, an n-well 42 and a p-well 44 are formed next to each other. The depths of the n-well 42 and the p-well 44 are deeper than the depths of the n-well 18 and the p-wells 16 and 19. The n-well 42 and the p-well 44 are retrograded wells. The n-well 42 and the p-well 44 overlap each other in their border. A semi-recessed LOCOS oxidation layer 46 is formed over the border between the n-well 42 and the p-well 44.

A p-channel transistor 48 is formed in the n-well 42. The p-channel transistor 48 includes a gate electrode 50, a source 52 and a drain 54. An n-channel transistor 56 is formed in the p-well 44. The n-channel transistor 56 includes a gate electrode 58, a source 60 and a drain 62. A semi-recessed LOCOS oxidation layer 64 isolates the border region 13 from the peripheral circuit area 14.

An interlayer dielectric layer 66 is formed on the main surface of the p-type silicon substrate 10 to cover the memory cell area 12, the border region 13, and the peripheral circuit area 14. Contact holes are formed in the interlayer dielectric layer 66 to expose the drains 28 and 34. The contact holes are filled with electrically conductive materials 68 and 70. A wiring layer 72 is formed on the interlayer dielectric layer 66. The drain 28 is connected to the drain 34 through the wiring layer 72 and the electrically conductive materials 68 and 70.

An interlayer dielectric layer 74 is formed on the interlayer dielectric layer 66. A plurality of wiring layers is arranged on the interlayer dielectric layer 74. An interlayer dielectric layer 76 is formed on the interlayer dielectric layer 74 to cover the wiring layers on the interlayer dielectric layer 74. A bit line 80 is formed on the interlayer dielectric layer 76. Contact holes are formed in the interlayer dielectric layers 66, 74 and 76. The contact holes are respectively filled with electrically conductive materials 82, 84, and 86. The bit line 80 is connected to the source 26 through the electrically conductive material 86, a pad layer 88, the electrically conductive material 84, a pad layer 90 and the electrically conductive material 82.

Figure 2:
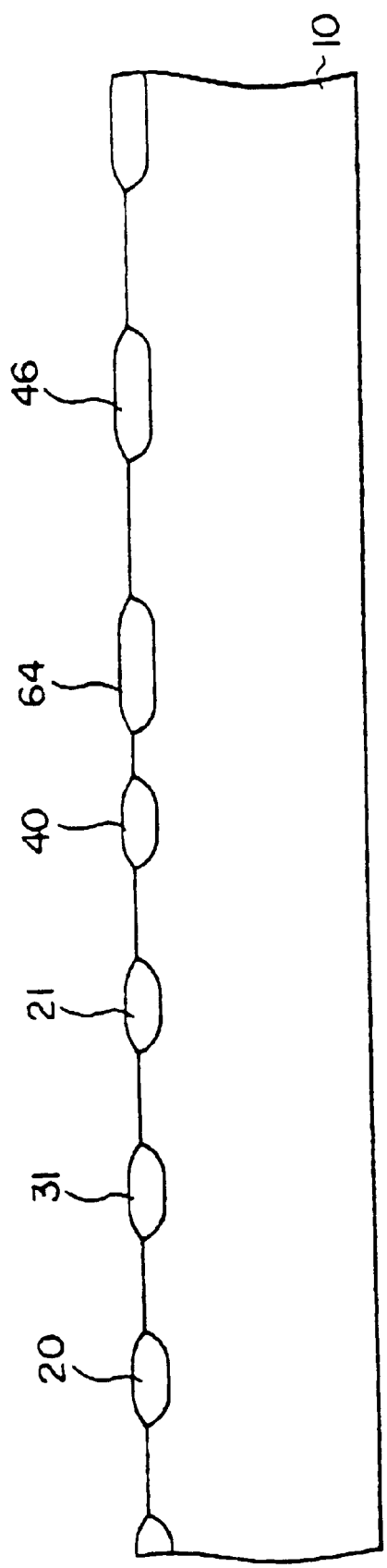
FIG. 2 shows a cross section of a semiconductor memory device in a first manufacturing step in accordance with an embodiment of the present invention.

A manufacturing method for manufacturing a semiconductor memory device in accordance with one embodiment of the present invention is described below. Referring to FIG. 2, a plurality of trenches is formed in the main surface of the silicon substrate 10, which has an antioxidation film, such as silicon nitride, formed thereon. Oxidation layers are formed in the trenches using the LOCOS technique. Semi-recessed LOCOS oxidation layers 20, 21, 31, 40, 46 and 64 are thus formed. Preferably, each of the semi-recessed LOCOS oxidation layers has a thickness of about 0.2 µm to about 0.7 µm.

Figure 3:
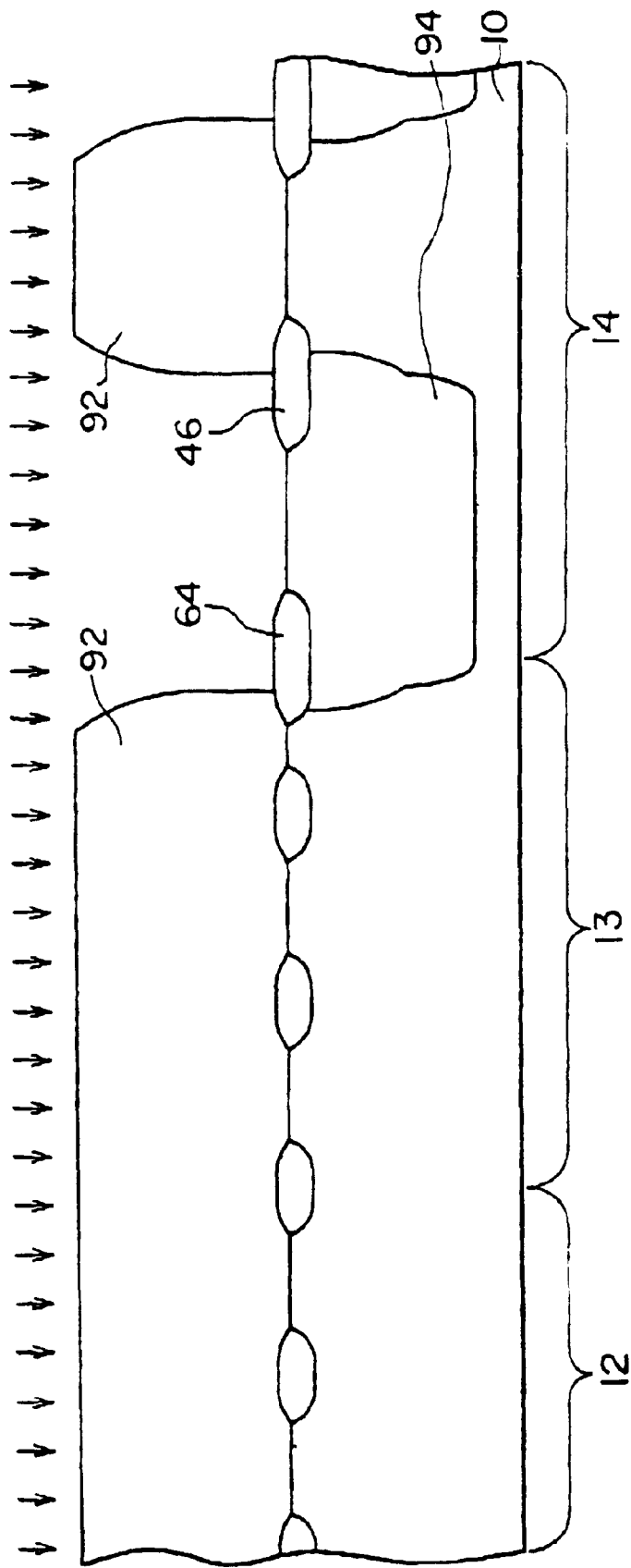
FIG. 3 shows a cross section of a semiconductor memory device in a second manufacturing step in accordance with the embodiment of the present invention.

Referring to FIG. 3, a resist pattern 92 having a thickness of about 3.0 µm to about 8.0 µm is formed such that an n-well formation area is opened in the peripheral circuit area 14. The resist pattern 92 on the semi-recessed LOCOS oxidation layer 64 may develop dimensional errors (deviations from design values) and resist deformation due to the proximity effect and the loading effect which are attributable to differences in pattern density of the processed patterns.

The silicon substrate 10 is implanted with phosphorus using the resist pattern 92 as a mask to form a low-resistance layer 94. The implantation energy ranges from about 500 KeV to about 3 MeV at a dose of about 5E12 to about 5E13.

Figure 4:
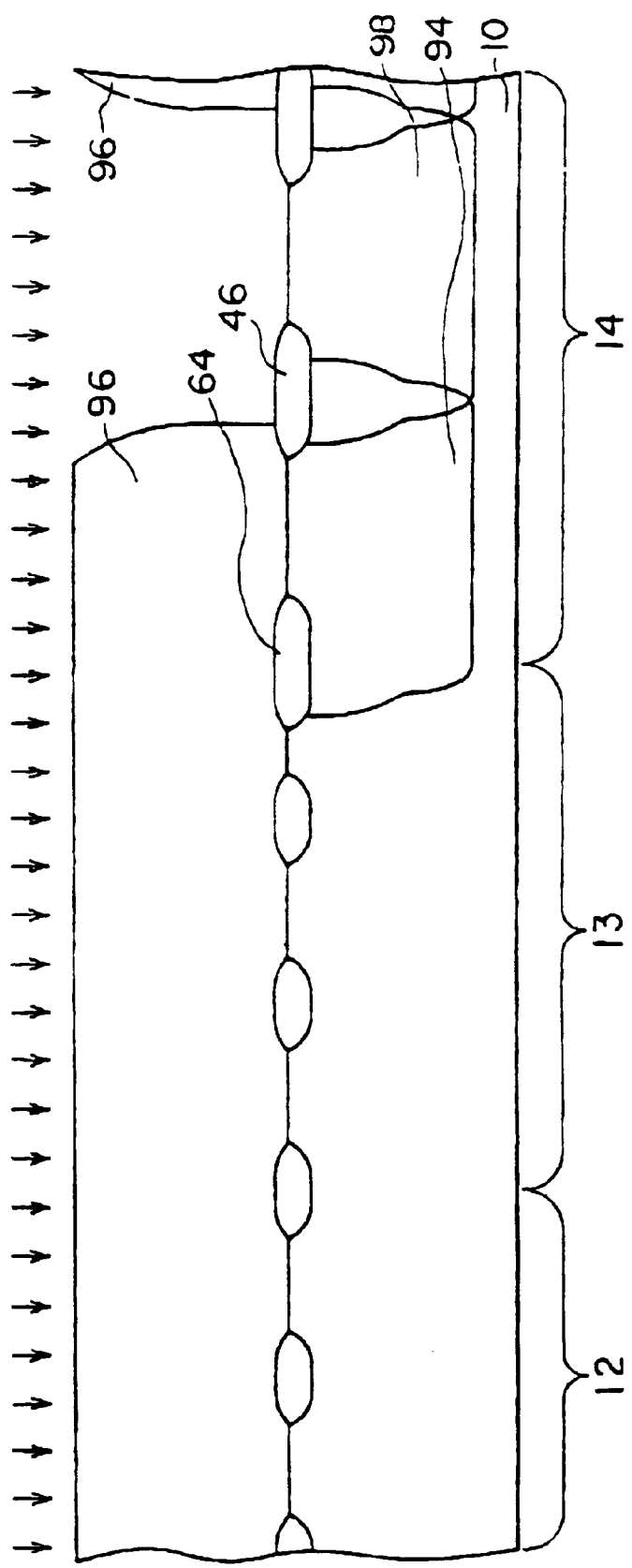
FIG. 4 shows a cross section of a semiconductor memory device in a third manufacturing step in accordance with the embodiment of the present invention.

Referring to FIG. 4, a resist pattern 96 having a thickness of about 3.0 µm to about 8.0 µm is formed so that a p-well formation area is opened in the peripheral circuit area 14. The resist pattern 96 on the semi-recessed LOCOS oxidation layer 46 may develop dimensional errors (deviations from design values) and resist deformations due to, for example, the proximity effect and the loading effect which are attributable to differences in pattern density of the processed patterns.

The silicon substrate 10 is implanted with boron using the resist pattern 96 as a mask to form a low-resistance layer 98. The implantation energy ranges from about 300 KeV to about 2 MeV at a dose of about 5E12 to about 5E13.

Figure 5:
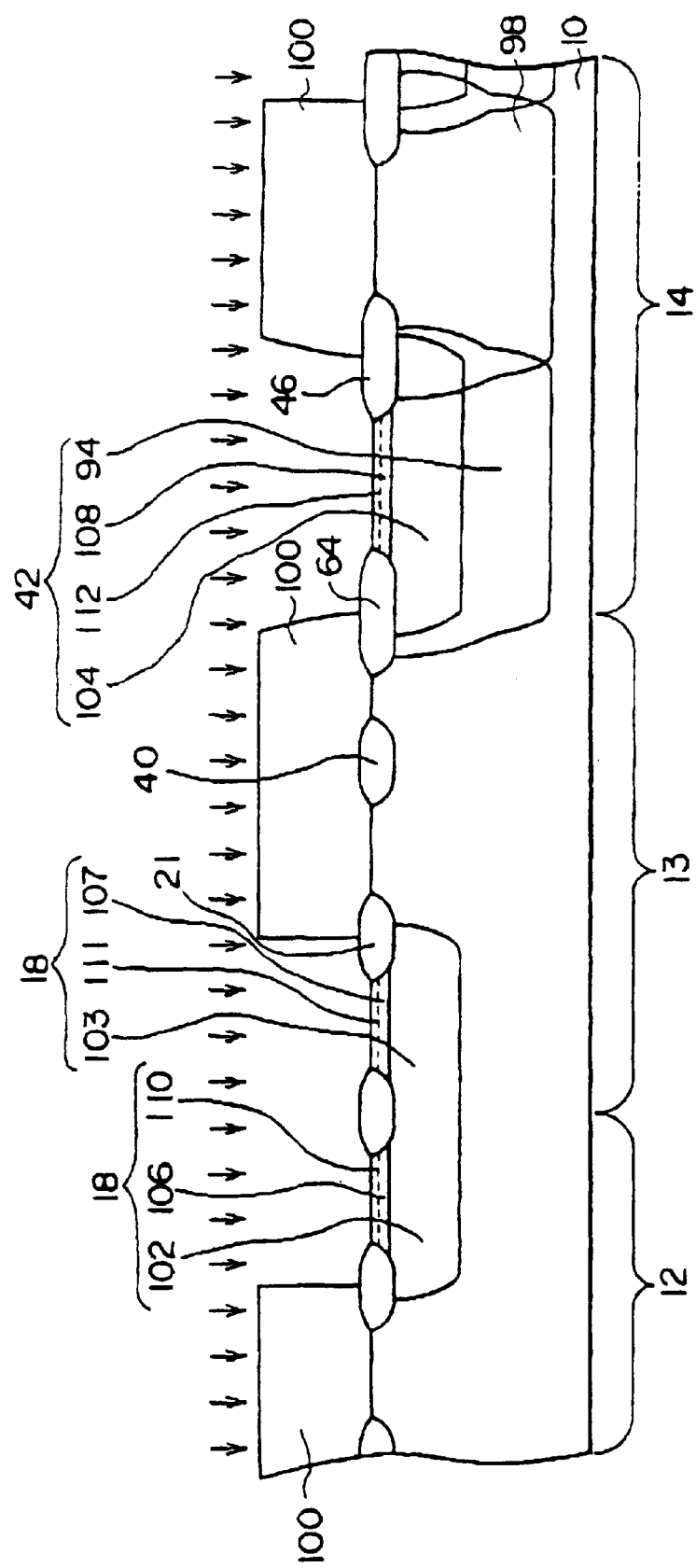
FIG. 5 shows a cross section of a semiconductor memory device in a fourth manufacturing step in accordance with the embodiment of the present invention.

Referring to FIG. 5, a resist pattern 100 having a thickness of about 1.2 µm to about 2.5 µm is formed so that n-well formation areas are opened in the memory cell area 12, the border region 13 and the peripheral circuit area 14.

Portions of the resist pattern 100 located over the semi-recessed LOCOS oxidation layers 46 and 64 suffer dimensional errors (deviations from design values) and resist deformation under the proximity effect and the loading effect that are attributable to differences in pattern density of the processed patterns. The pitch of the resist pattern in the memory cell area 12 and the border region 13 is fine while the pitch of the resist pattern in the peripheral circuit area 14 is coarse. The semi-recessed LOCOS oxidation layers 46 and 64 are located in the border between the border region 13 and the peripheral circuit area 14. Portions of the resist pattern 100 over the semi-recessed LOCOS oxidation layers 46 and 64 therefore are subject to the proximity effect and the loading effect.

The silicon substrate 10 is implanted with phosphorus using the resist pattern 100 as a mask to form channel cut layers 102, 103, and 104. The channel cut layers are arranged to prevent an operation of a parasitic MOS transistor beneath the semi-recessed LOCOS oxidation layer. The implantation energy ranges from about 200 KeV to about 500 KeV at a dose of about 3E12 to about 2E13.

The silicon substrate 10 is implanted with phosphorus with the resist pattern 100 as a mask to form punchthrough stopper layers 106, 107, and 108. The stopper layers control the short channel effect of the transistor. The implantation energy ranges from 100 KeV to 200 KeV at a dose of 2E12 to E1E13. Alternatively, the stopper layers 106, 107, and 108 are formed using arsenic. The implantation energy in this case ranges from 150 KeV to 300 KeV at a dose of 2E12 and 1E13.

The silicon substrate 10 is implanted with ions using the resist pattern 100 as a mask to form channel doped layers 110, 111 and 112. The channel doped layers 110, 111 and 112 adjust Vth of the transistor, and are formed by using the following implants (a), (b) and (c), alone or in combination:
  (a) phosphorus, about 20 KeV to about 100 KeV, about 1E12 to about 1E13.
  (b) boron difluoride, about 30 KeV to about 100 KeV, about 1E12 to about 1E13.
  (c) boron, about 10 KeV to about 50 KeV, about 1E12 to about 1E13.

The above steps complete the formation of the n-well 18, including the channel cut layer 102, the punchthrough stopper layer 106 and the channel doped layer 110 in the memory cell area 12, and the channel cut layer 103, the punchthrough stopper layer 107 and the channel doped layer 111 in the border region 13. In the peripheral circuit area 14, the formation of the n-well 42, including the low-resistance layer 94, the channel cut layer 104, the punchthrough stopper layer 108 and the channel doped layer 112, is completed.

Figure 6:
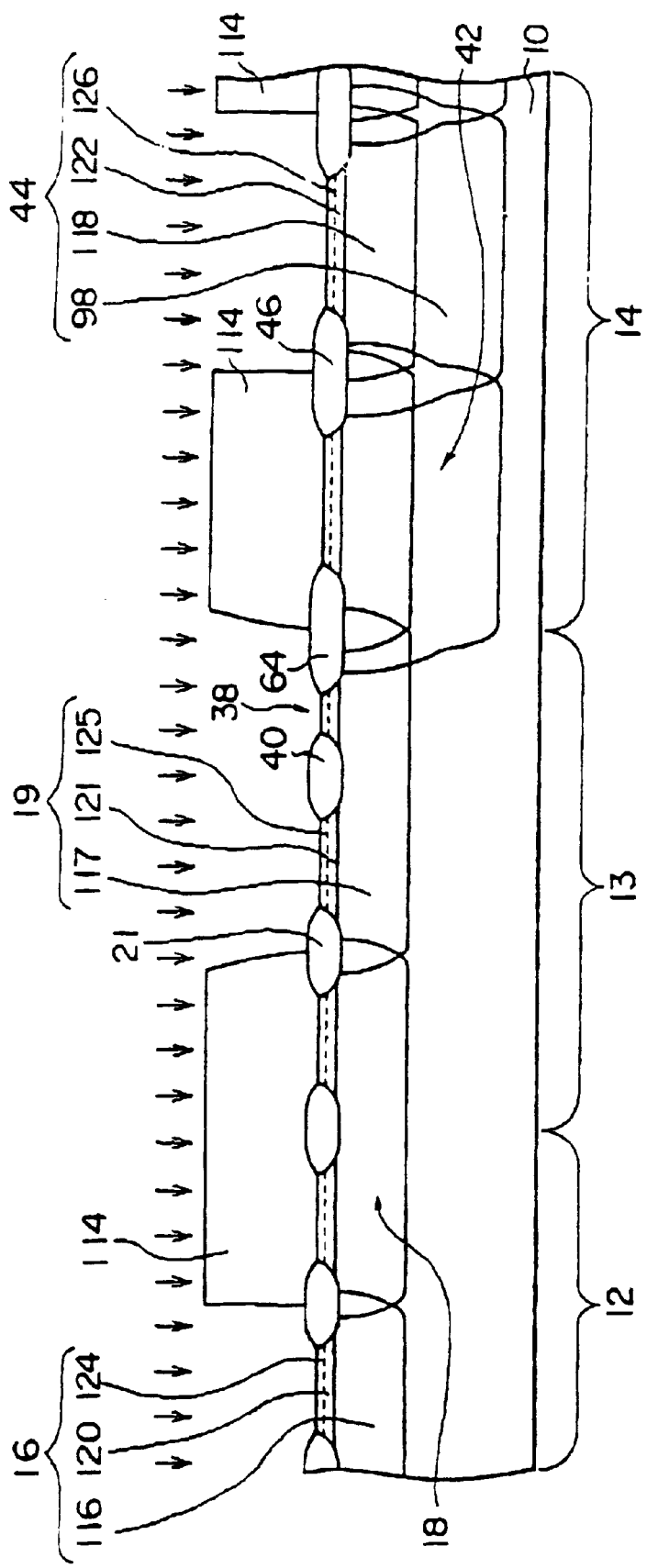
FIG. 6 shows a cross section of a semiconductor memory device in a fifth manufacturing step in accordance with the embodiment of the present invention.

Referring to FIG. 6, a resist pattern 114 having a thickness of about 1.2 µm to about 2.5 µm is formed such that p-well formation areas are opened in the memory cell area 12, the border region 13, and the peripheral circuit area 14. Portions of the resist pattern 114 located over the semi-recessed LOCOS oxidation layers 21 and 64 suffer dimensional errors (deviations from design values) and resist deformation due to the proximity effect and the loading effect, which are attributable to differences in pattern density of the processed patterns.

The silicon substrate 10 is implanted with boron using the resist pattern 114 as a mask to form channel cut layers 116, 117 and 118. The implantation energy ranges from about 100 KeV to about 300 KeV at a dose of about 3E12 to about 2E13.

The silicon substrate 10 is implanted with boron using the resist pattern 114 as a mask to form punchthrough stopper layers 120, 121 and 122. The implantation energy ranges from about 50 KeV to about 200 KeV at a dose of about 2E12 to about 1E13. The punchthrough stopper layers 120, 121 and 122 are respectively overlaid on the channel cut layers 116, 117 and 118, depending on the implantation energy applied. In this case, a single ion implantation process can form a layer that serves the purposes of the two layers.

The silicon substrate 10 is implanted with ions using the resist pattern 114 as a mask to form channel doped layers 124, 125 and 126. The channel doped layers 124, 125 and 126 are formed by using the following implants (a), (b), and (c), alone or in combination:

(a) phosphorus, about 20 KeV to about 100 KeV, about 1E12 to about 1E13.
(b) boron difluoride, about 30 KeV to about 150 KeV, about 1E12 to about 1E13.
(c) boron, about 10 KeV to about 50 KeV, about 1E12 to about 1E13.

The above steps complete the formation of the p-well 16, including the channel cut layer 116, the punchthrough stopper layer 120 and the channel doped layer 124 in the memory cell area 12. Also, the formation of the p-well 19, including the channel cut layer 117, the punchthrough stopper layer 121 and the channel doped layer 125, is completed in the border region 13. In the peripheral circuit area 14, the formation of the p-well 44, including the low-resistance layer 98, the channel cut layer 118, the punchthrough stopper layer 122 and the channel doped layer 126, is completed.

Figure 7:
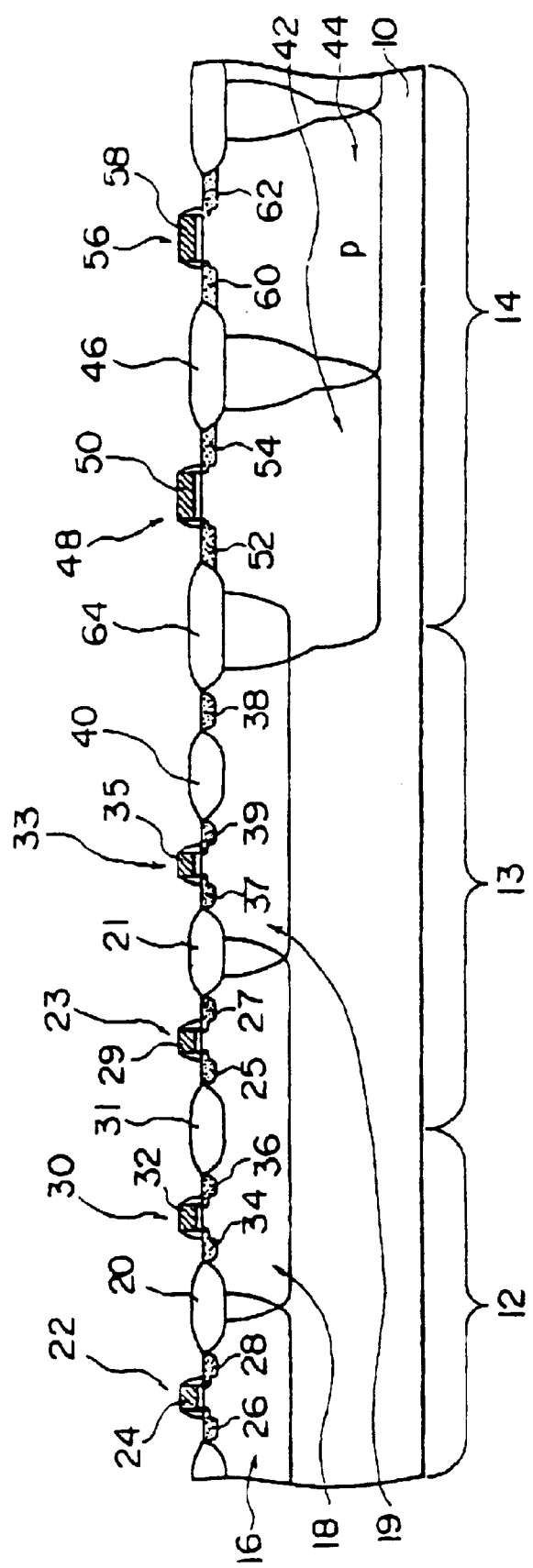
FIG. 7 shows a cross section of a semiconductor memory device in a sixth manufacturing step in accordance with the embodiment of the present invention.

The n-channel transistor 22, the p-channel transistor 30, the dummy transistor 23, the dummy transistor 33, the p-channel transistor 48, and the n-channel transistor 56, as shown in FIG. 7, may be formed by using a standard process technology. In the p-well 19, the well contact region 38 is also formed through the ion implantation, which is used to form the p-channel transistor.

The dummy transistors 33 and 23 are substantially identical in pattern to the n-channel transistor 22 and the p-channel transistor 30 in the memory cell area 12, respectively, in terms of the width of the well, the well spacing, the gate length, the gate width, the active area, and the inter-gate distance. With this arrangement, the device element density in the memory cell area 12 is substantially identical to the device element density in the border region 13.

Referring to FIG. 7, end sections of the p-well 19, the n-well 42 and the p-well 44 suffer positional errors beneath the semi-recessed LOCOS oxidation layers 21, 64, and 46, due to the proximity effect and the loading effect. The dummy transistors 33 and 23, which are isolated from each other by the semi-recessed LOCOS oxidation layer 21, are located in the border region 13. The impurity regions 25, 27, 37 and 39 of the dummy transistors 23 and 33 remain in a floating state. For this reason, even if the p-well 19 ingresses into the n-well 18, no latchup occurs. The semi-recessed LOCOS oxidation layers 64 and 46 are arranged in the peripheral circuit area 14. The peripheral circuit area 14 typically has an area margin. By increasing the isolation spacing by the semi-recessed LOCOS oxidation layer, the latchup is prevented.

Lines representing channel cut layers 102, 103, 104, 116, 117 and 118, punchthrough stopper layers 106, 107, 108, 120, 121 and 122, and channel doped layers 110, 111, 112, 124, 125 and 126 are not shown in FIG. 7.

The formation of the structure shown in FIG. 1 may be completed using a standard processing technology.

The structure of the well of the semiconductor memory device of this embodiment is now discussed from the standpoint of concentration. The well formation conditions are represented by values listed in Table 1 under column Deep Well B and column Shallow Well to be discussed below.

Figure 11:
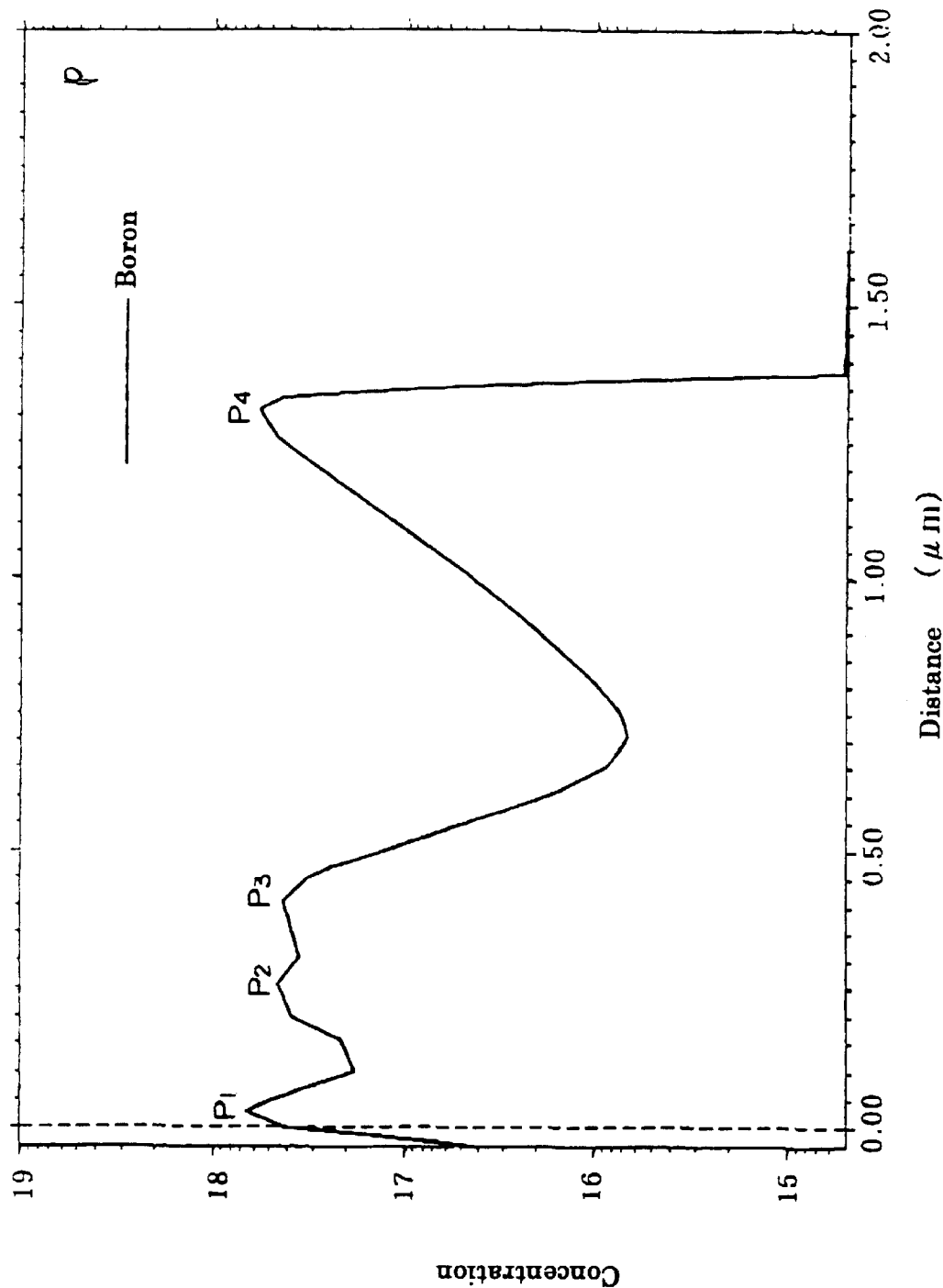
FIG. 11 is a graph showing an impurity concentration profile in the well subsequent to a fourth ion implantation into a p-well in a peripheral circuit area.

FIG. 11 shows an implant concentration profile in the well subsequent to conducting a fourth ion implantation in the p-well formation area in the peripheral circuit area. The distance indicated in FIG. 11 represents the depth of the well measured from the main surface of the silicon substrate. The concentrations in FIG. 11 are represented in a logarithmic scale. For example, value 17 represents $1\times10^{17}$ ions/cm$^3$.

In the peripheral circuit area, the p-well is formed by ion implantation that is conducted four times with different implantation energies and doses. There are four concentration peaks ($P_1$, $P_2$, $P_3$, and $P_4$) in the direction of the depth of the well. $P_1$ represents a channel doped layer, $P_2$ represents a punchthrough stopper layer, $P_3$ represents a channel cut layer, and $P_4$ represents a low-resistance layer for lowering the resistance of the well. In the following discussion in conjunction with graphs, the distance, the concentration, and peaks ($P_1$, $P_2$, $P_3$, and $P_4$) remain unchanged in meaning from those in FIG. 11.

Figure 12:
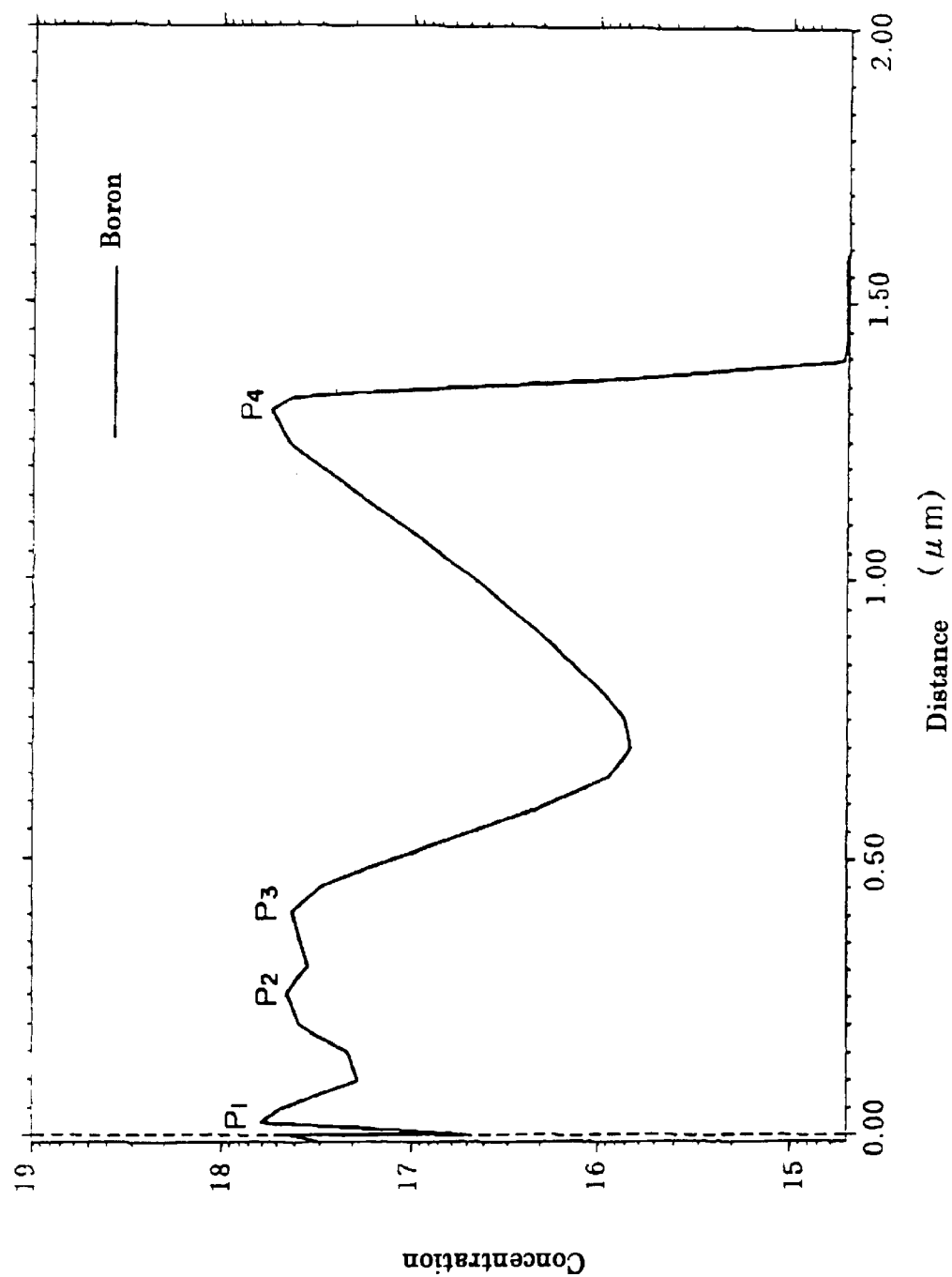
FIG. 12 is a graph showing an impurity concentration profile in the well which is measured after the p-well formation area of the peripheral circuit area is ion-implanted four times, a gate oxidation layer is formed, and a polysilicon layer becoming a gate electrode is annealed.

FIG. 12 shows an implant concentration profile of the implant in the well which is measured after the polysilicon layer, which becomes a gate electrode with a gate oxidation layer formed, is annealed. The p-well has four concentration peaks ($P_1$, $P_2$, $P_3$, and $P_4$).

Figure 13:
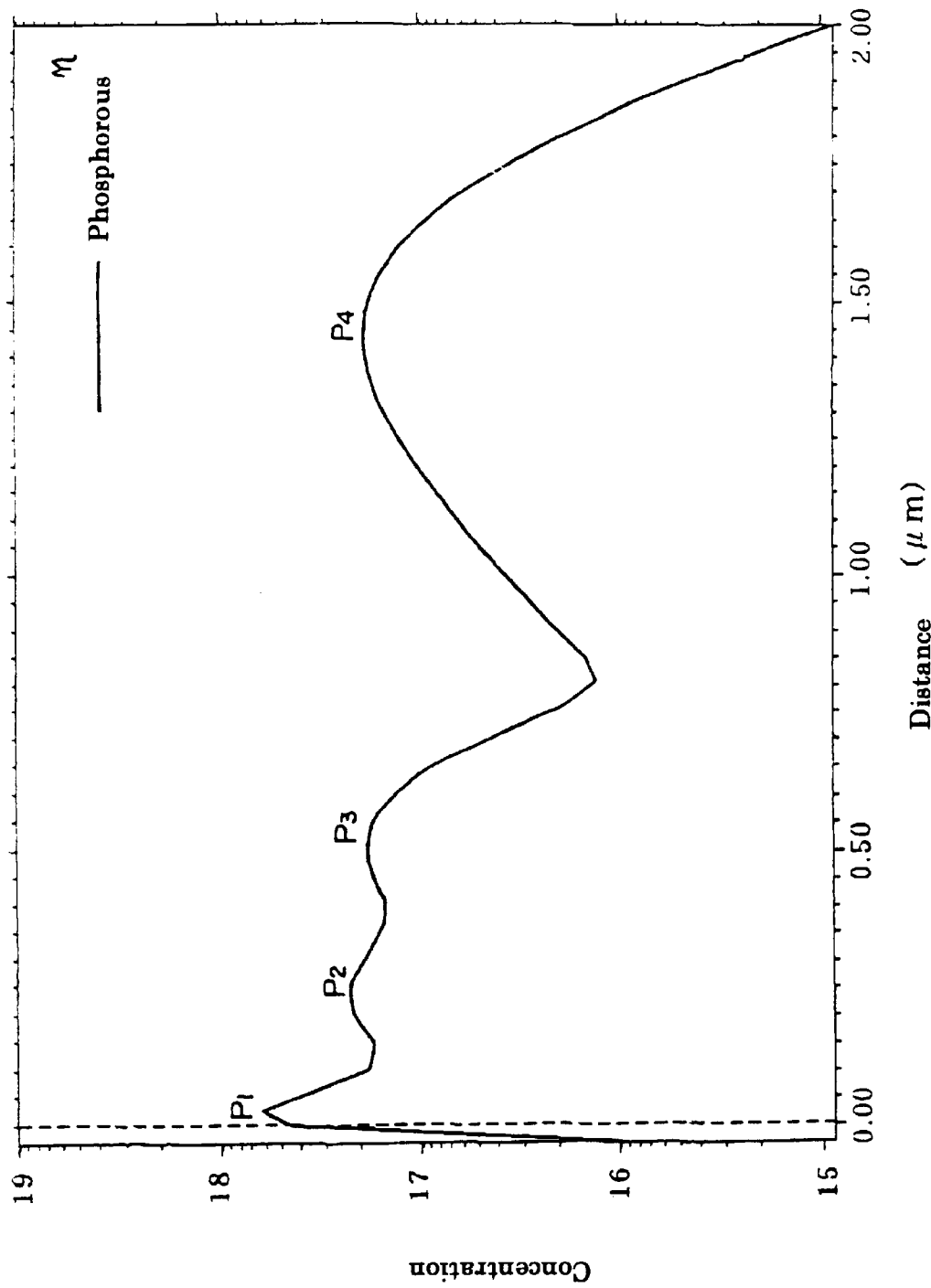
FIG. 13 is a graph showing an impurity concentration profile in the well subsequent to a fourth ion implantation into the n-well formation area of the peripheral circuit area.
Figure 14:
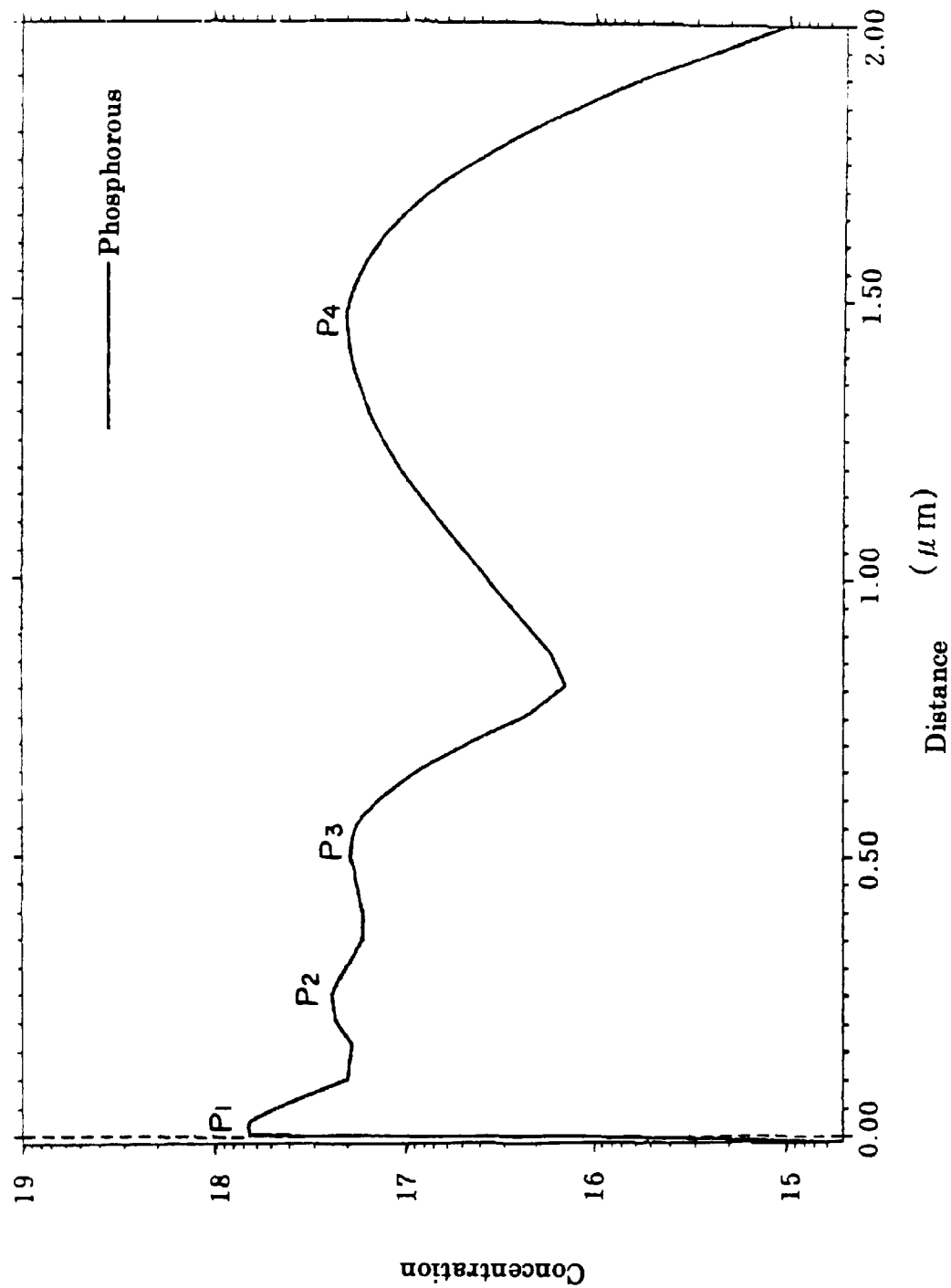
FIG. 14 is a graph showing an impurity concentration profile in the well which is measured after the n-well formation area of the peripheral circuit area is ion-implanted four times, a gate oxidation layer is formed, and a polysilicon layer becoming a gate electrode is annealed.

FIG. 13 shows an implant concentration of an implant subsequent to conducting a fourth ion implantation into the n-well formation area in the peripheral circuit area. In the peripheral circuit area, the n-well is formed by ion implantation that is conducted four times with different implantation energies and doses. There are four concentration peaks ($P_1$, $P_2$, $P_3$, and $P_4$) in the direction of depth of the well. FIG. 14 shows a concentration profile of the implant in the well which is measured after the polysilicon layer, which becomes a gate electrode with a gate oxidation layer formed, is annealed. The n-well has four concentration peaks ($P_1$, $P_2$, $P_3$, and $P_4$).

Figure 15:
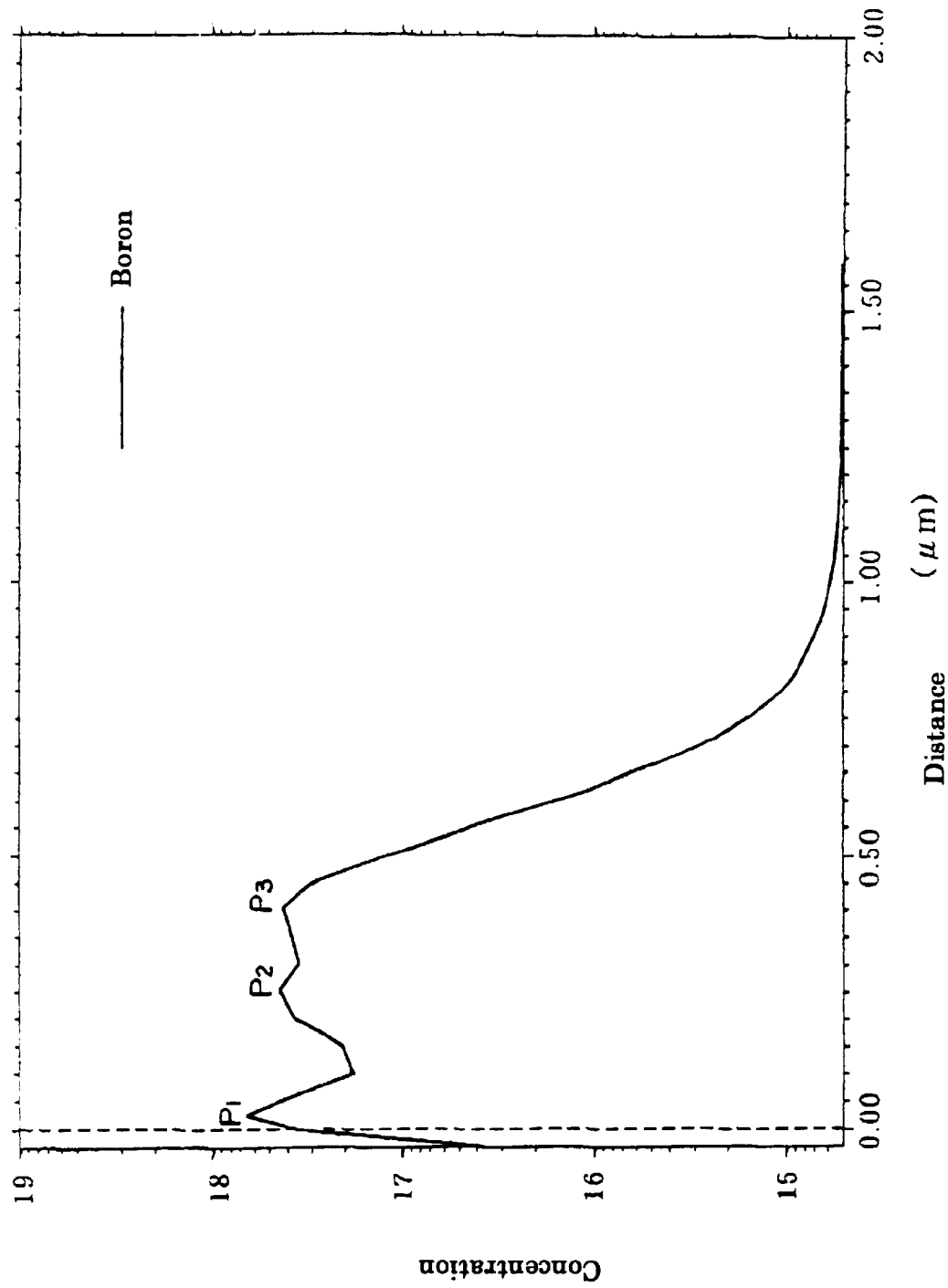
FIG. 15 is a graph showing an impurity concentration profile in the well subsequent to a third ion implantation into the p-well formation area of the memory cell area.

FIG. 15 shows an implant concentration profile in the well subsequent to conducting a third ion implantation into the p-well formation area in the memory cell area.

Figure 16:
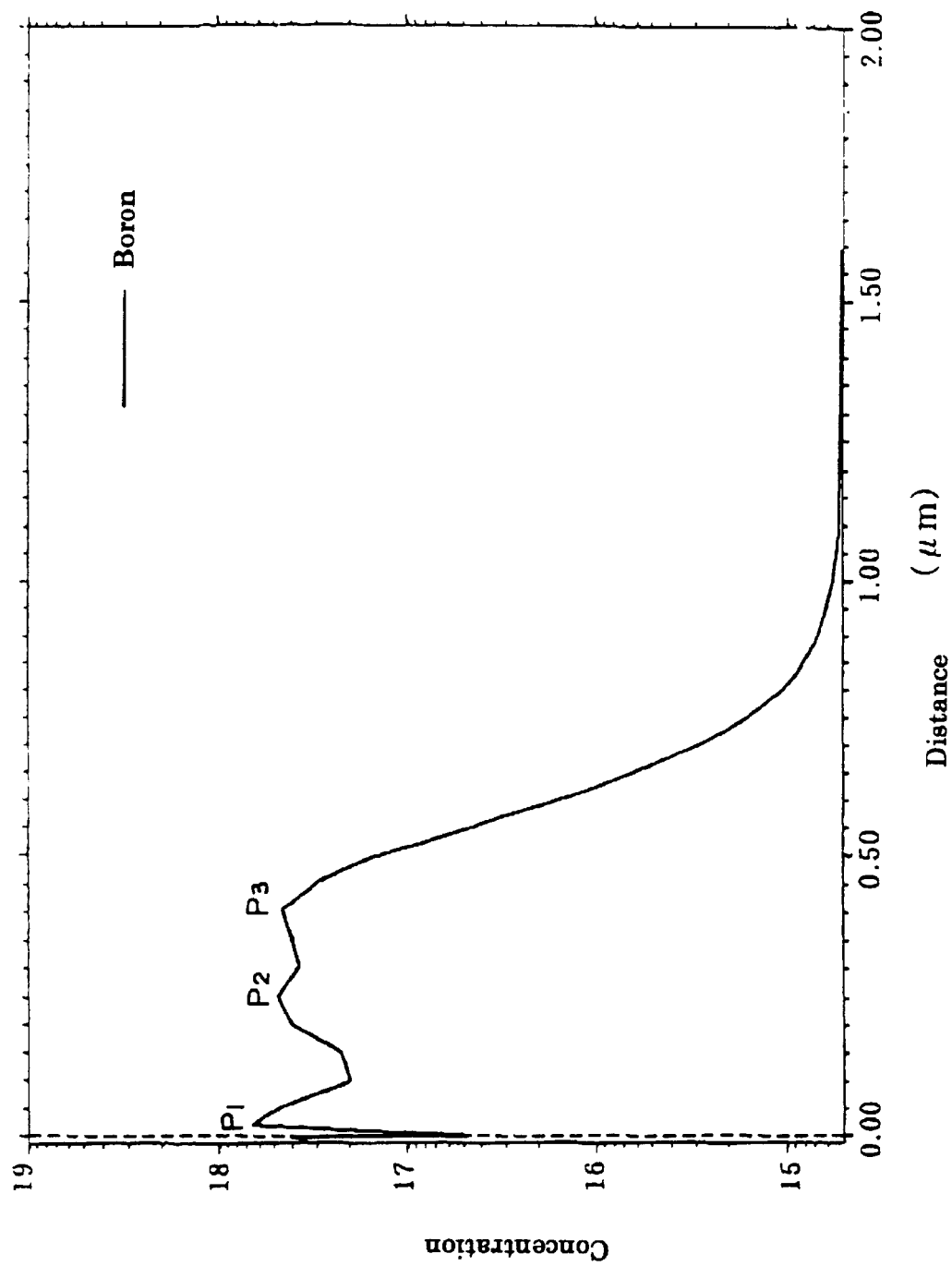
FIG. 16 is a graph showing an impurity concentration profile in the well which is measured after the p-well formation area of the memory cell area is ion-implanted three times, a gate oxidation layer is formed, and a polysilicon layer becoming a gate electrode is annealed.

In the memory cell area, the p-well is formed by ion implantation that is conducted three times with different implantation energies and doses. There are three concentration peaks ($P_1$, $P_2$, and $P_3$) in the direction of depth of the well. FIG. 16 shows a concentration profile of the implant in the well which is measured after the polysilicon layer, which becomes a gate electrode with a gate oxidation layer formed, is annealed. The p-well has three concentration peaks ($P_1$, $P_2$, and $P_3$).

Figure 17:
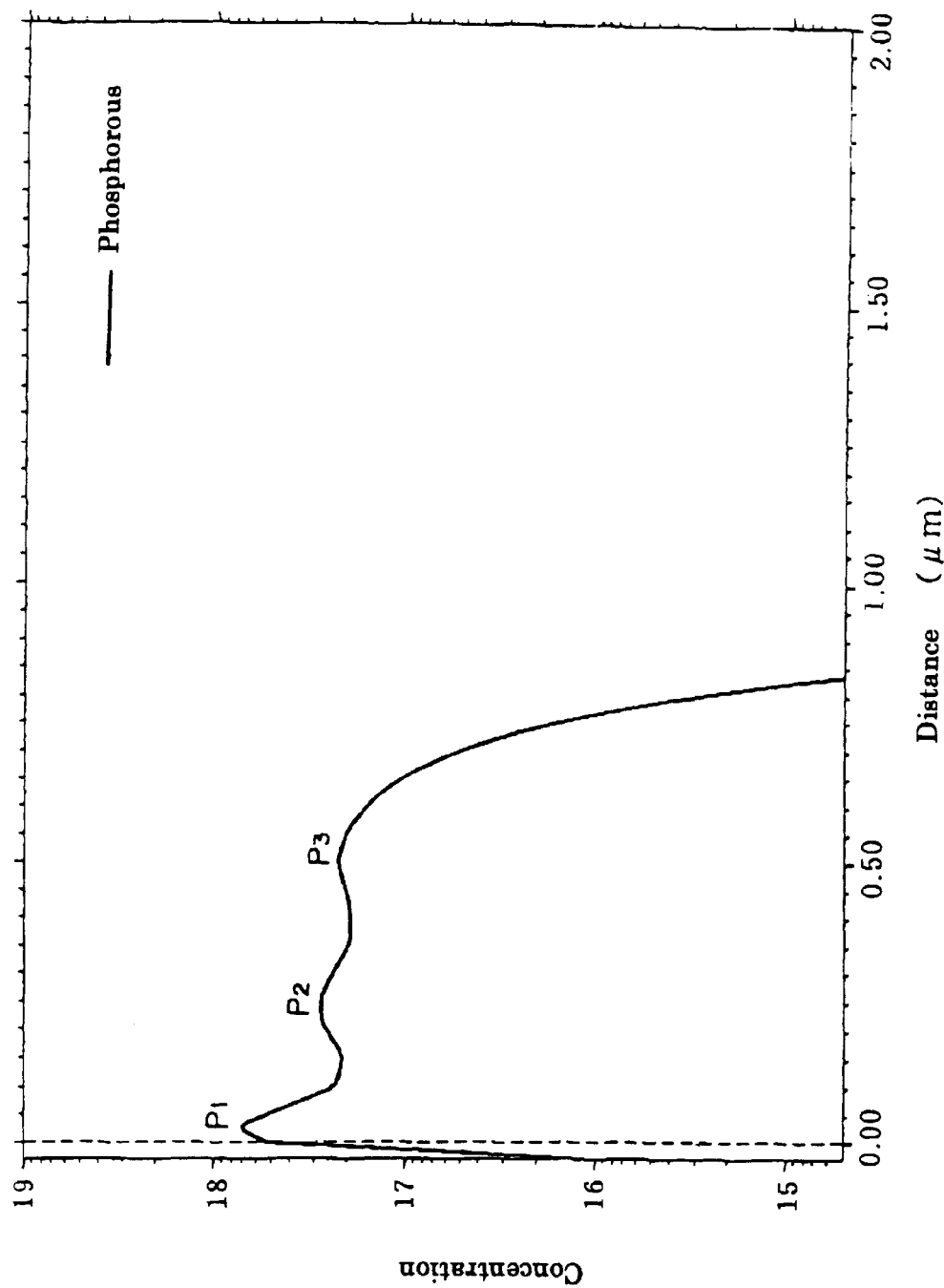
FIG. 17 is a graph showing an impurity concentration profile in the well subsequent to a third ion implantation into the n-well formation area of the memory cell area.
Figure 18:
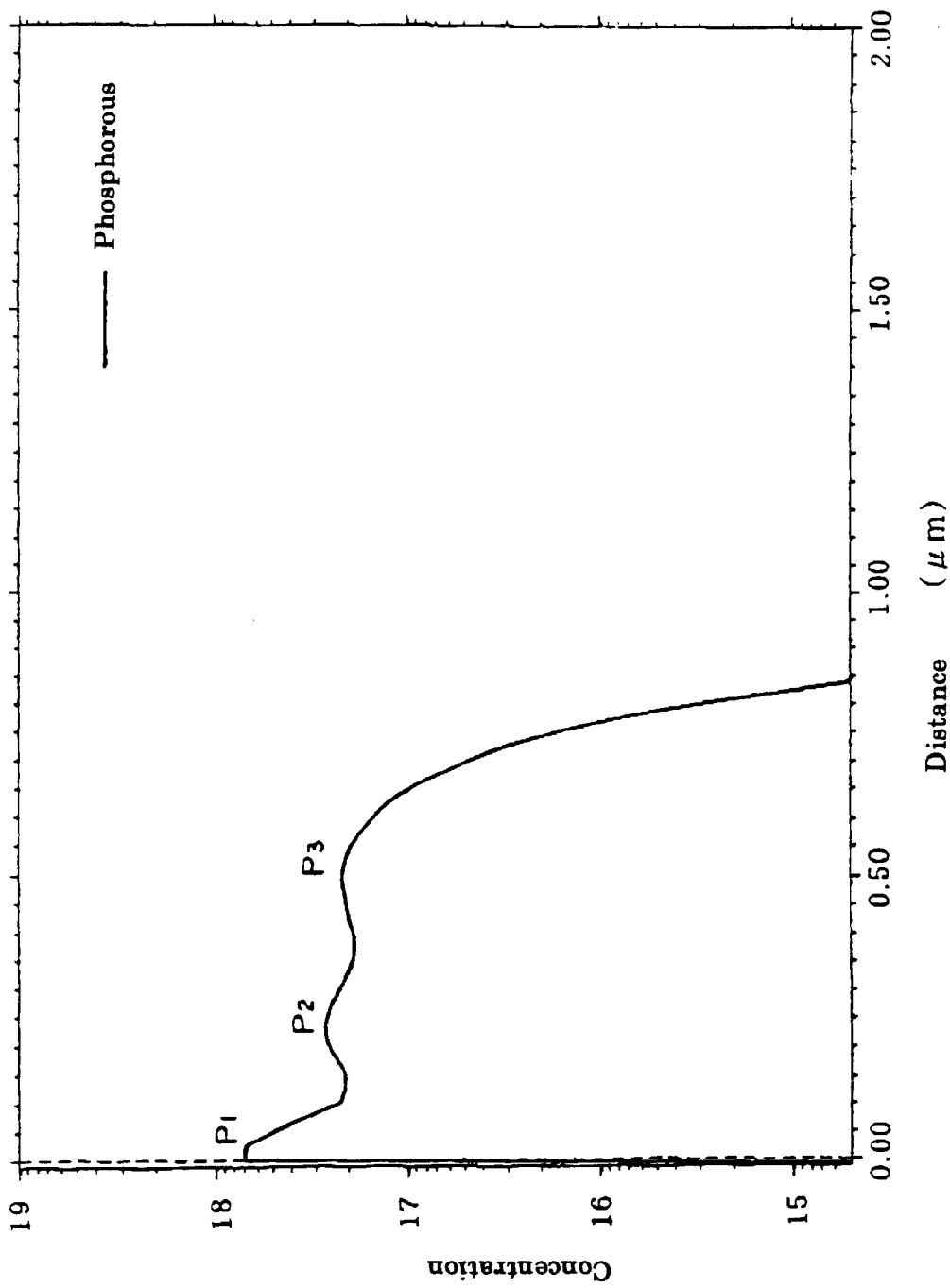
FIG. 18 is a graph showing an impurity concentration profile in the well which is measured after the n-well formation area of the memory cell area is ion-implanted three times, a gate oxidation layer is formed, and a polysilicon layer becoming a gate electrode is annealed.

FIG. 17 shows an implant concentration profile in the well subsequent to conducting a third ion implantation into the n-well formation area in the memory cell area. In the memory cell area, the n-well is formed by ion implantation that is conducted three times with different implantation energies and doses. There are three concentration peaks ($P_1$, $P_2$, and $P_3$) in the direction of depth of the well. FIG. 18 shows a concentration profile of the implant in the well which is measured after the polysilicon layer, which becomes a gate electrode with a gate oxidation layer formed, is annealed. The n-well has three concentration peaks ($P_1$, $P_2$, and $P_3$).

In accordance with embodiments of the present invention, a semiconductor memory device has a memory cell area 12 having a well depth shallower than the well depth of the peripheral circuit area 14. This arrangement reduces the possibility of the generation of latchup, while shortening the length of the device isolation structure between the n-well and the p-well in the memory cell area. The reason for this reduction follows.

The latchup occurs when the product of a leakage current in a parasitic MOS transistor or a substrate current and the resistance of the substrate exceeds a certain value. To reduce the substrate resistance, a deep well needs to be formed. The thickness of the resist pattern is proportional to the depth of the well. For this reason, to form a deep well, the thickness of a resist pattern has to be increased.

If a deep well is formed with a thick resist pattern, the n-well 42 and the p-well 44 overlap each other in a large area beneath the semi-recessed LOCOS oxidation layer 46 in the peripheral circuit area 14, as shown in FIG. 1. The reason for this is discussed, referring to FIG. 8.

Figure 8:
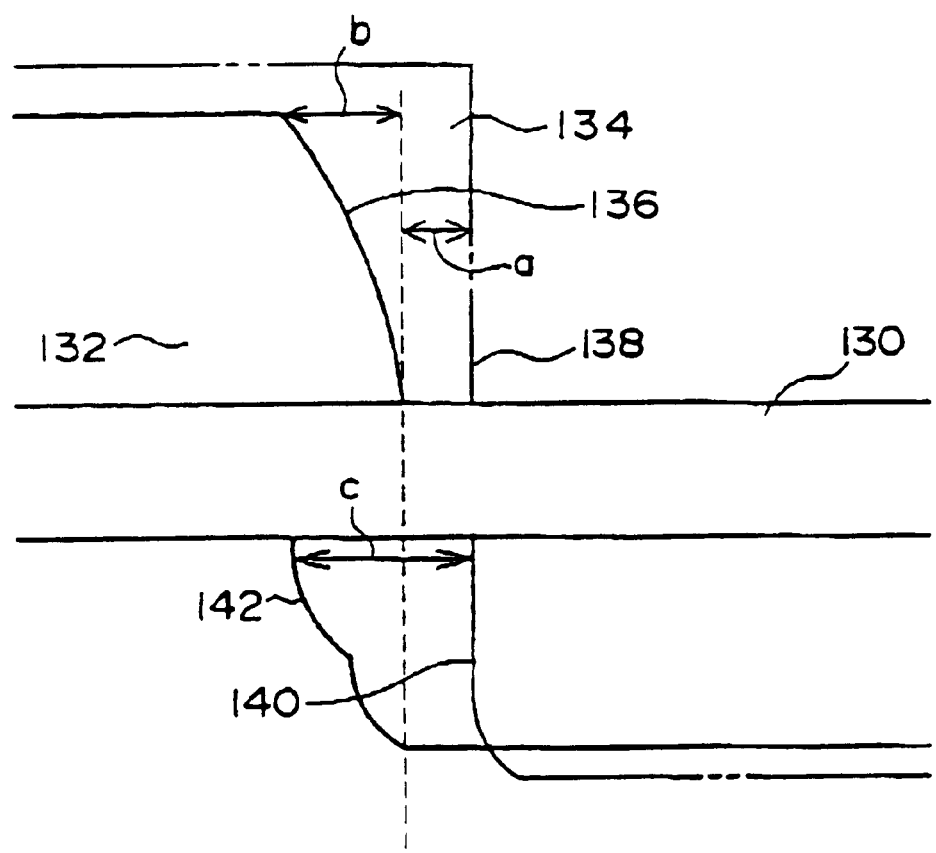
FIG. 8 is a cross-sectional view showing a change in configuration of a resist pattern.

FIG. 8 shows a state in which a resist pattern 132 is formed over a device isolation structure 130. FIG. 8 shows a resist end portion 136, namely, the end portion of the resist pattern 132. FIG. 8 also shows a designed resist pattern 134, and a designed resist end portion 138 of the designed resist pattern 134.

The letter a represents a receding distance due to the proximity effect and loading effect. The letter b represents a shrinkage at the upper edge of the resist when the resist pattern is baked. The top edge of the resist end portion 136 recedes by an amount of a+b from the resist end portion 138.

Reference numeral 140 denotes a well end portion if the well is to be formed with the designed resist pattern 134 as a mask. Reference numeral 142 denotes a well end portion when the well is formed with the resist pattern 132 as a mask. The upper edge of the well end portion 142 advances by an amount c from the upper edge of the well end portion 140 under the influence of the recession of the top edge of the resist end portion 136. This increases the intrusion of one well into the adjacent well, thereby expanding the overlapped area. The effect of this expanded overlapped area is discussed, referring to FIG. 9.

Figure 9:
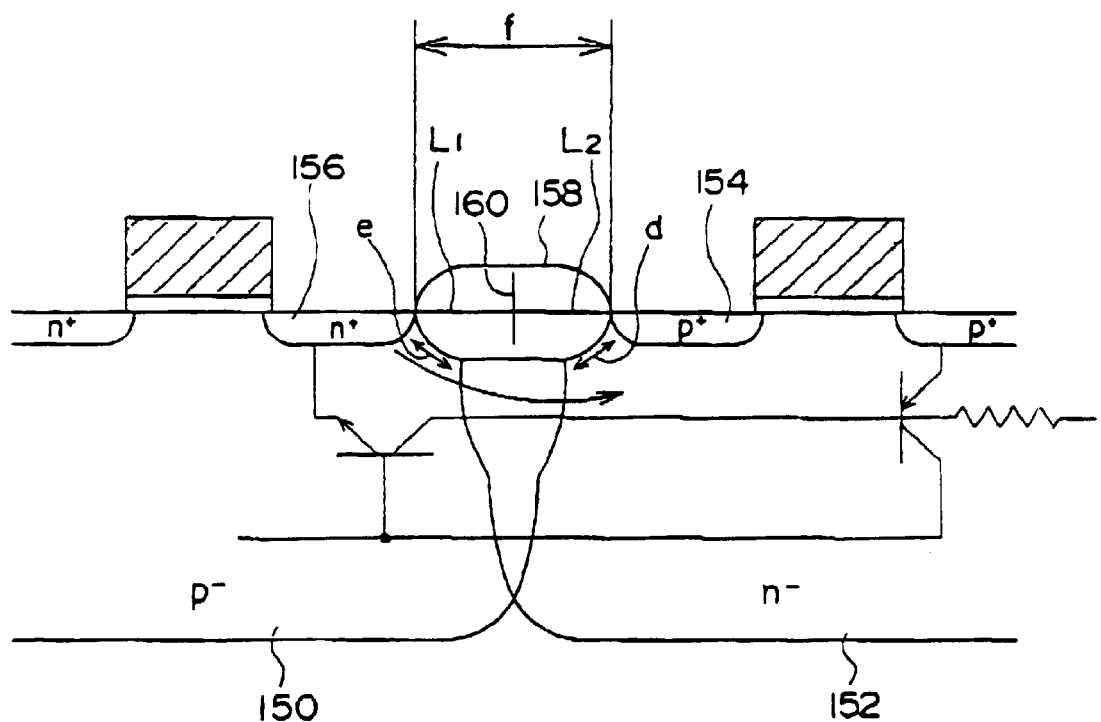
FIG. 9 is a cross-sectional view to illustrate a latch-up phenomenon.

When a p-well 150 and an n-well 152 overlap each other in a large area, as shown in FIG. 9, the distance d between a p-type source/drain 154 and the p-well 150 and/or the distance e between an n-type source/drain 156 and the n-well 152 is shortened depending on the ion implantation dose during the well formation. When this distance shortens, for example, when the distance e shortens, a leakage current of a parasitic MOS transistor tends to flow to the n-well 152 from the n-type source/drain 156 through the p-well 150. This is attributed to a shortened effective channel length of the parasitic MOS. The leakage current in the parasitic MOS transistor may work as a trigger current for latchup.

If a well is formed using a thin resist pattern, for example, having a thickness of 2 $\mu$m, the overlapped area is made relatively small. This is because neither the receding distance a at the resist end portion nor the shrinkage b at the top end edge of the resist occur in the end portion of the resist pattern.

When the length f of the device isolation structure 158 is made greater, the distances d and e may not become shorter. In the peripheral circuit area having space margin available, the length f of the device isolation structure 158 may be made greater. In the peripheral circuit area where no additional space is available, miniaturization of the memory cell may not be achieved if the length f of the device isolation structure 158 is made greater.

The substrate current is relatively large in the peripheral circuit area, because a transistor having a wide channel width and a large driving power is arranged in the peripheral circuit area.

To prevent latchup, the substrate resistance needs to be reduced. For this reason, the well depth has to be increased in the peripheral circuit area. On the other hand, the substrate current is relatively small in the memory cell area, because the size of a transistor constituting a memory cell is small. The latchup is controlled without greatly reducing the substrate resistance. A shallow well depth of the memory cell area is thus acceptable.

For the reasons discussed above, the well depth is set to be shallow in the memory cell area In this way, the p-well and the n-well are overlapped in a small region, reducing the possibility of the generation of latchup.

Experiments were conducted to demonstrate the advantages described above. A deep well (as deep as 2.0 $\mu$m) is formed, and a plurality of samples of semi-recessed LOCOS oxidation layer having different lengths and a shallow well (as shallow as 0.8 $\mu$m) are formed, and a plurality of samples of semi-recessed LOCOS oxidation layer are prepared. The well formation conditions are shown in Table 1. The thickness of the semi-recessed LOCOS oxidation layer is 0.4 $\mu$m.

TABLE 1

|        |                              | Deep well A | Deep well B | Shallow well |
|--------|------------------------------|-------------|-------------|--------------|
| N-well | Photoresist thickness        | 3.8 $\mu$m  | 3.8 $\mu$m  | 2.0 $\mu$m   |
|        | (1) Low-resistance layer     | P           | P           |              |
|        |                              | 1.2 MeV     | 1.2 MeV     |              |
|        |                              | 1E13        | 1E13        |              |
|        | (2) Channel cut layer        | P           | P           | P            |
|        |                              | 360 KeV     | 360 KeV     | 360 KeV      |
|        |                              | 4E12        | 6E12        | 6E12         |
|        | (3) Punchthrough stopper layer | P         | P           | P            |
|        |                              | 180 KeV     | 180 KeV     | 180 KeV      |
|        |                              | 2E12        | 2E12        | 2E12         |
|        | (4) Channel doped layer      | $BF_2$      | $BF_2$      | $BF_2$       |
|        |                              | 70 KeV      | 70 KeV      | 70 KeV       |
|        |                              | 6E12        | 6E12        | 6E12         |
| P-well | (1) Low-resistance layer     | B           | B           |              |
|        |                              | 700 KeV     | 700 KeV     |              |
|        |                              | 1E13        | 1E13        |              |
|        | (2) Channel cut layer        | B           | B           | B            |
|        |                              | 150 KeV     | 150 KeV     | 150 KeV      |
|        |                              | 4E12        | 8E12        | 8E12         |
|        | (3) Punchthrough stopper layer | B         | B           | B            |
|        |                              | 80 KeV      | 80 KeV      | 80 KeV       |
|        |                              | 4E12        | 8E12        | 8E12         |
|        | (4) Channel doped layer      | $BF_2$      | $BF_2$      | $BF_2$       |
|        |                              | 70 KeV      | 70 KeV      | 70 KeV       |
|        |                              | 3.5E12      | 3.5E12      | 3.5E12       |

Leakage currents in these samples were measured. The measuring conditions are as follows. Currents flowing from an n-well into a source of an n-channel transistor were measured under the conditions of an n-well potential of 5 V and a p-well potential of 0 V with the source of the n-channel transistor at 0 V and a drain of the n-channel transistor at 5 V, and a gate of the n-channel transistor at 5 V. Currents flowing from the p-well into the source of a p-channel transistor were measured under the conditions of an n-well potential of 5 V and a p-well potential of 0 V with the source of the p-channel transistor at 5 V, a drain of the p-channel transistor at 0 V, and a gate of the p-channel transistor at 0 V.

Figure 10:
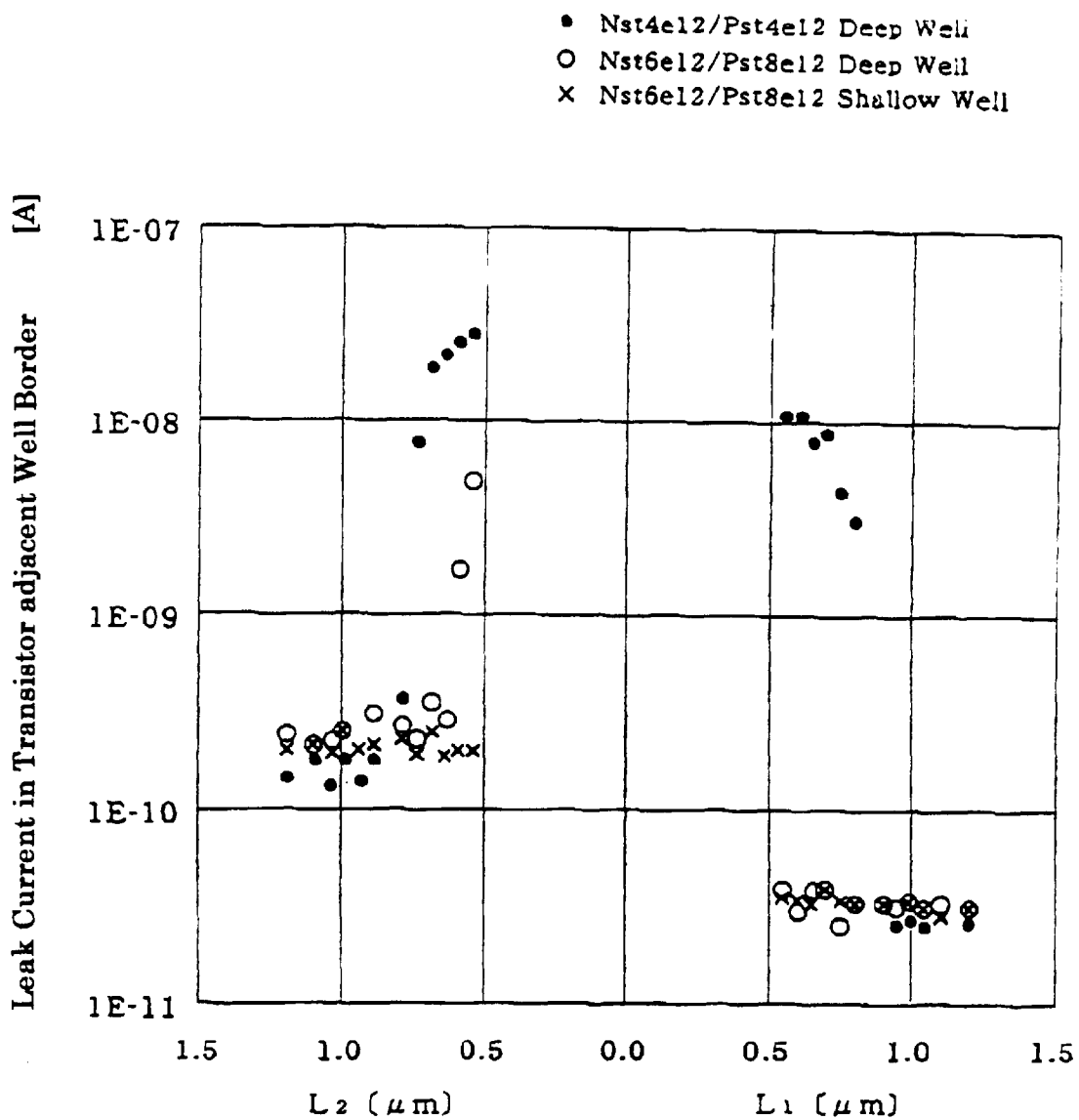
FIG. 10 is a graph showing the relationship between the depth of a well and a leakage current.

FIG. 10 shows the measurement results. Solid circles represent data of a deep well A, blank circles represent data of a deep well B, and crosses (x) represent data of a shallow well. Before discussing the measurement results, the definitions of distances $L_1$ and $L_2$ are discussed first. Referring to FIG. 9, let us assume a vertical line segment 160 runs transversely across the device isolation structure 158 at a center thereof, and $L_1$ represents the distance from the vertical line segment 160 to the n-type source/drain 156, and $L_2$ represents the distance from the vertical line segment 160 to the p-type source/drain 154. For example, with either $L_1$ or $L_2$ being 0.5 $\mu$m, the length of the semi-recessed LOCOS oxidation layer is 1.0 $\mu$m.

Referring to FIG. 10, even with the distance being close to 0.5 $\mu$m in the shallow wells of p-type and n-type, the level of leakage currents is relatively lower than those of the deep wells.

This shows that, when the well depth in the memory cell area is shallower than the well depth in the peripheral circuit area, the leakage current of the parasitic MOS transistor does not increase, and thus the possibility of generation of latchup is lower even when the length of the semi-recessed LOCOS oxidation layer is shortened in the memory cell area, compared to a structure in which the well depth in the memory cell area is generally equal to the well depth in the peripheral circuit area.

The present invention provides further advantages as described below.

In the embodiment shown in FIG. 1, the n-well 42 is in contact with the border region 13 but not in contact with the memory cell area 12, and the dummy transistors 23 and 33 are formed in the border region 13. This arrangement prevents latchup withstandability from being degraded even if the end sections of the p-well 19, the n-well 42 and the p-well 44 suffer positional errors beneath the semi-recessed LOCOS oxidation layers 21, 64, and 46, due to the proximity effect and the loading effect.

Referring to FIG. 1, the border region 13 includes the well contact region 38 in this embodiment. The SRAM is miniaturized by allowing the border region 13 to serve as the well contact region 38.

Referring to FIG. 1, the n-well 42 is arranged between the p-well 19 and the p-well 44. The p-well 19 is thus isolated from the p-well 44. This arrangement prevents a substrate current from flowing from the p-well 44 to the p-well 19, improving latchup withstandability.

The silicon substrate 10 is of a p-type. With the p-type silicon substrate 10, the p-wells in the memory cell area 12 are connected to each other through the silicon substrate 10, and thus the resistance of the wells is lowered. A rise in substrate potential is thus suppressed in the n-channel transistor formation area, which has a relatively large substrate current.

Referring to FIG. 1, the potential of the impurity regions 25, 27, 37, and 39 in the border region 13 is set to be in a floating condition. Leakage current paths from the wells to the impurity regions 25, 27, 37, and 39 are thus disconnected. The same advantages will be provided if the impurity regions 37 and 39 in the border region 13 are set to be identical in potential to the n-well 42.

Referring to FIG. 1, the depth of the n-well 18 is generally equal to the depth of the p-well 16 in this embodiment. Accordingly, substantially no imbalance in performance between transistors, attributable to the difference between the well depths, occurs in the memory cell area 12.

Referring to FIG. 1, the p-well 16 and n-well 18 are formed down to a level lower than the semi-recessed LOCOS oxidation layer in this embodiment. This arrangement allows the p-well 16 and the n-well 18 to extend to a well contact region (not shown). The p-well 16 and the n-well 18 are thus easily connected to the well contact region.

Referring to FIG. 1, the p-well 16 and n-well 18 are formed down to a level lower than the semi-recessed LOCOS oxidation layers in this embodiment. This arrangement prevents the sources 26 and 36 and the drains 28 and 34 from becoming too shallow.

Referring to FIG. 1, in accordance with this embodiment, the depths of the source 26 and the drain 28, formed in the p-well 16, are substantially equal to the depths of the drain 34 and the source 36, formed in the n-well 18. As a result, substantially no imbalance in performance between transistors, attributable to the difference between the source and drain depths, occurs in the memory cell area 12.

Referring to FIG. 1, each of the memory cell area 12, the border region 13, and the peripheral circuit area 14 has a twin well structure. For this reason, after the low-resistance layer is formed in areas that become the n-well 42 and the p-well 44, the channel cut layer, the punchthrough stopper layer and the channel doped layer are concurrently formed in areas that become the n-well 18 and the n-well 42, and the channel cut layer, the punchthrough stopper layer and the channel doped layer are concurrently formed in areas that become the p-well 16, the p-well 19 and the p-well 44. As a result, the methods in accordance with the embodiments of the present invention simplify the manufacturing steps.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A manufacturing method for manufacturing a semiconductor memory device having a peripheral circuit area, a memory cell area, and a border region positioned in a border between the peripheral circuit area and the memory cell area on a main surface of a semiconductor substrate, the method comprising:

(a) the step of forming a device isolation structure on the main surface, (b) the step of forming a first well in contact with the border region but not in contact with the memory cell area, by ion-implanting an impurity in the peripheral circuit area only, (c) the step of forming a second well of a first conductivity type by ion-implanting an impurity in the memory cell area, wherein the second well is shallower in depth than the first well and is formed down to a level lower than the device isolation structure, (d) the step of forming a third well of a second conductivity type by ion-implanting an impurity in the memory cell area, wherein the third well is equal in depth to the second well and is adjacent to the second well beneath the device isolation structure, and (e) the step of forming a field effect transistor in the memory cell area, wherein the step (e) comprises the step of forming dummy elements that do not function as active device elements in the border region at substantially the same device element forming density as that of the memory cells in the memory cell area.

2. A manufacturing method for manufacturing a semiconductor memory device according to claim 1, wherein the step (b) includes forming a twin-well having an n-type well and a p-type well, with the n-type well positioned to the side of the border region, the step (c) includes forming the second well in the border region, and the step (d) includes forming the third well in the border region, and wherein the second well or the third well, whichever is the p-type, is positioned to the side of the peripheral circuit area.

* * * * *